(12) United States Patent
Takeuchi

(10) Patent No.: US 7,200,051 B2
(45) Date of Patent: Apr. 3, 2007

(54) SEMICONDUCTOR INTEGRATED CIRCUIT DEVICE HAVING POWER SUPPLY STARTUP SEQUENCE

(75) Inventor: Atsushi Takeuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 79 days.

(21) Appl. No.: 11/030,164

(22) Filed: Jan. 7, 2005

(65) Prior Publication Data
US 2005/0276127 A1 Dec. 15, 2005

(30) Foreign Application Priority Data
Jun. 11, 2004 (JP) .............................. 2004-173485

(51) Int. Cl.
*G11C 7/00* (2006.01)

(52) U.S. Cl. .................. 365/189.09; 365/226; 365/227

(58) Field of Classification Search ............ 365/189.09
See application file for complete search history.

(56) References Cited

U.S. PATENT DOCUMENTS 5,287,361 A * 2/1994 Joffre .......................... 714/10
5,763,960 A * 6/1998 Ceccherelli et al. .......... 307/41
6,650,089 B1 * 11/2003 Freeman et al. ............. 320/132
2002/0054517 A1 * 5/2002 Takeuchi et al. ....... 365/189.06

FOREIGN PATENT DOCUMENTS

| JP | 60-261099 | 12/1985 |
|---|---|---|
| JP | 63-311696 | 12/1988 |
| JP | 06-215563 | 8/1994 |

* cited by examiner

*Primary Examiner*—Thong Q. Le
(74) *Attorney, Agent, or Firm*—Arent Fox, LLP

(57) ABSTRACT

A semiconductor integrated circuit device, which drives a first region and a second region provided via capacitance to a positive internal power supply and a negative internal power supply respectively, comprises a first internal power supply generation circuit that drives the first region to the positive internal power supply. In addition, the semiconductor integrated circuit device has a power supply sequencer that drives the first region to an overdrive potential that is higher than the positive internal power supply potential by starting up the first internal power supply generation circuit at power supply startup while clamping the second region at a predetermined potential and then by canceling the clamped state of the second region, steps down the first region from the overdrive potential toward the positive internal power supply potential so as to step down the second region to a negative potential through coupling of the capacitance.

12 Claims, 16 Drawing Sheets

MEMORY CELL STRUCTURE AND CAPACITOR NETWORK

POWER SUPPLY STARTUP METHOD

FIG. 6  POWER SUPPLY SEQUENCER AND POWER SUPPLY CIRCUITS

POWER SUPPLY STARTUP SEQUENCE

FIG. 8

POWER SUPPLY STARTUP SEQUENCE

| Vol. | Block/Phase | | 1b | 2b | 3b | 4b | 5b |
|---|---|---|---|---|---|---|---|
| VPL | Clamper to VSS | 24 | O | | | | |
| VPL | Power-on Driver | 22 | | O | | | |
| VPL | Power-on Detector | 21 | | O | | | |
| VPL | Generator | 25 | | | O | O | |
| VBLEQ | Clamper to VSS | 24 | O | | | | |
| VBLEQ | Clamper to VPL | 23 | | O | | | |
| VBLEQ | Generator | 26 | | | O | O | O |
| VBB | Clamper to VSS | 30 | O | | | | |
| VBB | Power-on Detector | 28 | | O | O | | |
| VBB | Generator | 29 | | | O | O | O |
| VNN | Clamper to VSS | 34 | O | (O) | | | |
| VNN | Power-on Detector | 32 | | | | O | |
| VNN | Generator | 33 | | | | O | O |

O: enable

VPL CLAMPER CIRCUIT
VBLEQ CLAMPER CIRCUIT

VBB CLAMPER CIRCUIT
VNN CLAMPER CIRCUIT

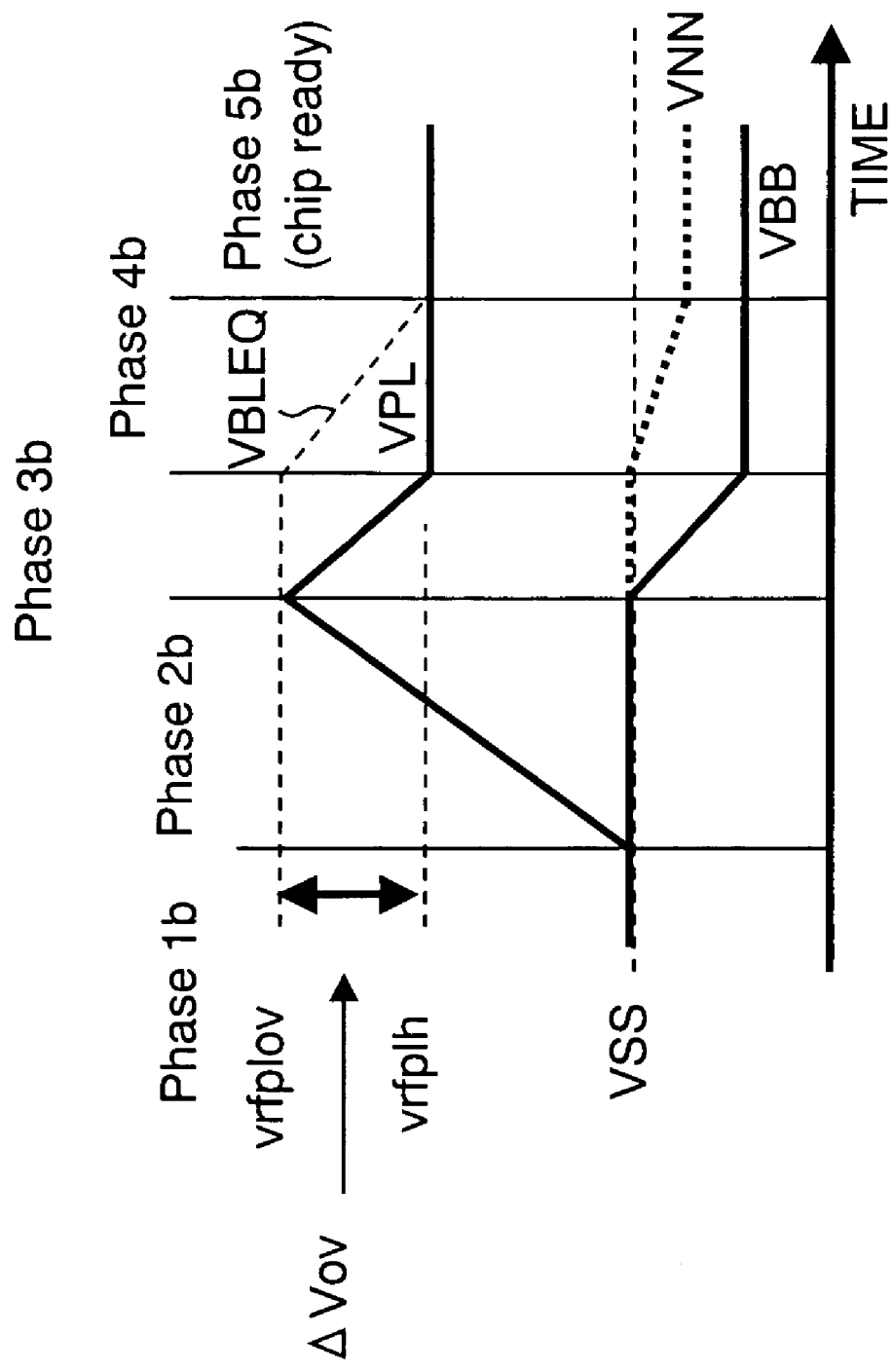

US 7,200,051 B2

SEMICONDUCTOR INTEGRATED CIRCUIT DEVICE HAVING POWER SUPPLY STARTUP SEQUENCE

CROSS-REFERENCE TO RELATED APPLICATIONS

This application is based upon and claims the benefit of priority from the prior Japanese Patent Application No. 2004-173485, filed on Jun. 11, 2004, the entire contents of which are incorporated herein by reference.

BACKGROUND OF THE INVENTION

1. Field of the Invention

The present invention relates to a semiconductor memory having a power supply startup sequence and, more particularly, to a semiconductor integrated circuit device having a power supply startup sequence that enhances the capability of a negative power supply generation circuit.

2. Description of the Related Art

A semiconductor integrated circuit device and, more particularly, a semiconductor memory, must drive all internal power supplies at a predetermined voltage at power supply startup within a startup time that is defined by the specifications. Internal power supplies are driven to predetermined voltages in accordance with the charging of parasitic capacitances or stabilizing capacitances that are formed in the semiconductor substrate by using an external power supply Vdd. Internal power supplies include a variety of power supplies such as an intermediate power supply with an intermediate potential between the external power supply and ground power supply, a booster power supply that is higher than the external power supply, and a negative power supply that is below the ground power supply.

In the case of DRAM, which is one type of semiconductor memory, a memory cell is constituted by one transistor and one capacitor. A back gate bias power supply VBB constituting a negative power supply is applied to the back gate region of the cell transistor and a cell plate power supply constituting an intermediate power supply is applied to the opposing electrodes of the cell capacitor. Further, a precharge power supply for bitline pair and a negative-power-supply for wordline reset power supply as a wordline unselected power supply are required.

More particularly, power supplies of the memory core region where memory cells are formed, such as a cell-plate power supply VPL, a back gate bias power supply VBB, a bitline pre-charge power supply VBLEQ, and a word-line reset power supply VNN, and so forth, for example, are started up at a predetermined voltage by charging parasitic capacitances that include capacitances between impurity diffusion regions within the memory core region. Therefore, these internal power supplies are mutually connected via parasitic capacitances and the startup of each of the internal power supplies during the power supply startup must be performed according to a predetermined sequence, as described in Japanese Patent Application Laid Open No. S60-261099 (disclosed on Dec. 24, 1985), Japanese Patent Application Laid Open No. S63-311696 (disclosed on Dec. 20, 1988), and Japanese Patent Application Laid Open No. H6-215563 (disclosed on Aug. 5, 1994), for example.

FIG. 1 shows an example of a conventional power supply startup method. FIG. 1A shows a power supply startup sequence, where time is plotted on the horizontal axis and the voltage is plotted on the vertical axis. Further, FIG. 1B is an equivalence circuit diagram that shows in the relationship of the parasitic capacitances between the internal power supplies VPL, VBB, VNN, and VBLEQ with a ground power supply VSS. As shown in FIG. 1B, these internal power supplies are interconnected via parasitic capacitances C1 to C4. Therefore, in order to startup the internal power supplies at each of these potentials, these parasitic capacitances must be charged.

According to the power supply startup sequence shown in FIG. 1A, in phase 1a, after the booster power supply or similar has risen in accordance with the rise of the external power supply VDD and has stabilized at a predetermined potential, the startup sequence of the remaining internal power supplies begins. First, in phase 2a, while the back gate bias power supply VBB and word-line reset power supply VNN are clamped to the ground power supply VSS, the cell plate power supply VPL and bit-line pre-charge power supply VBLEQ are driven to a predetermined potential by using the external power supply VDD. When the cell plate power supply VPL and so forth reaches a predetermined potential, in phase 3a, the back gate bias power supply VBB and word-line reset power supply VNN are driven to a negative potential by means of a negative power supply generation circuit such as a pumping circuit. The cell plate power supply VPL and the like, which started up first, is fixed at a predetermined potential while the negative power supply drops to the predetermined negative potential. Further, when the negative power supply reaches the predetermined negative potential, the startup of all the internal power supplies is complete and, in phase 4a, these power supplies enter the standby state.

Thus, the startup at the predetermined potential is performed by stepping up or stepping down the positive internal power supplies and negative internal power supplies in different phases.

SUMMARY OF THE INVENTION

However, driving to a predetermined negative potential is implemented by means of a pumping circuit that utilizes a pumping capacitor in order to start up an internal negative power supply. However, there is the problem that it takes time to start up the negative power supply, if the current driving capability (pumping capability) of this pumping circuit is small. Particularly in the case of the back gate bias power supply VBB, the parasitic capacitance that is to be charged within the memory core increases as the capacity of the memory increases and the power supply generation circuit therefore requires a greater current driving capability during power supply startup. Meanwhile, the back gate bias power supply, which is one type of negative power supply, only biases the back gate region of the cell transistor to a negative potential during standby and the negative power supply generation circuit of the back gate bias power supply may have a current driving capability of a magnitude that allows the voltage variation caused by a leak current and so forth to be absorbed. That is, in a negative power supply generation circuit, there is a discrepancy between the current driving capability required at power supply startup and the current driving capability required during standby. However, the negative power supply generation circuit must satisfy the capability required at power supply startup and, in this case, if the negative power supply generation circuit is afforded the current driving capability (pumping capability) that is required at power supply startup, the capacity of the pumping capacitor must be increased. Hence, a large surface area is required and constitutes a barrier to integration. Further, a negative power supply other than a back gate bias power supply, such as a wordline reset power supply, for example, is also considered to be subject to the same problems.

Accordingly, an object of the present invention is to provide a semiconductor memory having a power supply sequence that enhances the driving capability of a negative power supply generation circuit.

In order to achieve the above object, according to a first aspect of the present invention, a semiconductor integrated circuit device, which drives a first region and a second region provided via capacitance to a positive internal power supply and a negative internal power supply respectively, comprises a first internal power supply generation circuit that drives the first region to the positive internal power supply. In addition, the semiconductor integrated circuit device has a power supply sequencer that drives the first region to an overdrive potential that is higher than the positive internal power supply potential by starting up the first internal power supply generation circuit at power supply startup while clamping the second region at a predetermined potential and then by canceling the clamped state of the second region, steps down the first region from the overdrive potential toward the positive internal power supply potential so as to step down the second region to a negative potential through coupling of the capacitance.

In a preferred embodiment according to the first aspect above, the semiconductor integrated circuit device comprises a second internal power supply generation circuit that drives the second region to a negative internal power supply, wherein the second internal power supply generation circuit includes a pumping circuit that has a pumping capacitor and an oscillation circuit supplying a drive pulse to the pumping circuit.

In a preferred embodiment example according to the first aspect, the semiconductor integrated circuit device is a semiconductor memory, the first region is a memory-cell cell plate region, the second region is a back gate region of a memory-cell cell transistor, the positive internal power supply is a cell plate power supply, and the negative internal power supply is a back gate bias power supply.

In another preferred embodiment according to the first aspect, the semiconductor integrated circuit device is a semiconductor memory, the first region is either one or both of the memory-cell cell plate region or bitline region, the second region is either one or both of a back gate region or wordline region of the memory-cell cell transistor, the positive internal power supply is either one or both of a cell plate power supply or bitline reset power supply, and the negative internal power supply is either one or both of a back gate bias power supply or wordline reset power supply.

In a preferred embodiment, a memory-cell cell capacitor is constituted by a trench capacitor that is formed within a cell plate region, wherein a back gate region is formed in the cell plate region and the source and drain regions of the cell transistor are formed in the back gate region.

According to the first aspect, at power supply startup, the first region is stepped up above the positive internal power supply potential and then the first region is stepped down so that the second region is stepped down to a negative potential by means of capacitance coupling. Therefore, even though the driving capability of the negative power supply generation circuit, for driving the negative internal power supply that is applied to the second region, is not raised, the second region can be stepped down to a negative potential in a short time at power supply startup.

BRIEF DESCRIPTION OF THE DRAWINGS

FIG. 8 is a power supply startup sequence diagram of this embodiment;

FIG. 16 shows another modified example of the power supply startup method of this embodiment.

DESCRIPTION OF THE PREFERRED EMBODIMENTS

An embodiment of the present invention will be described hereinbelow with reference to the drawings. However, the technological scope of the present invention is not limited to these embodiments but, rather, covers the items appearing in the claims and any equivalents thereof.

Figure 1B:
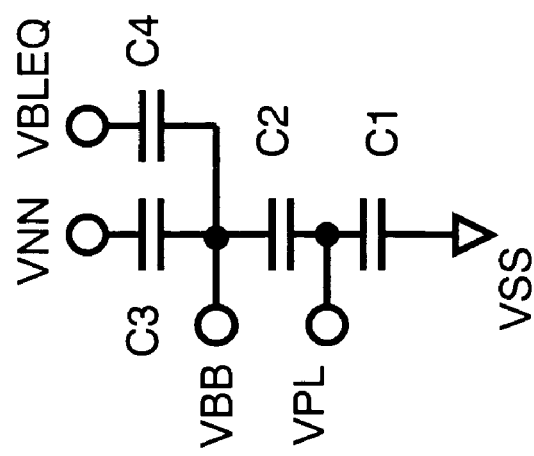
FIG. 1 shows an example of a conventional power supply startup method.
Figure 1A:
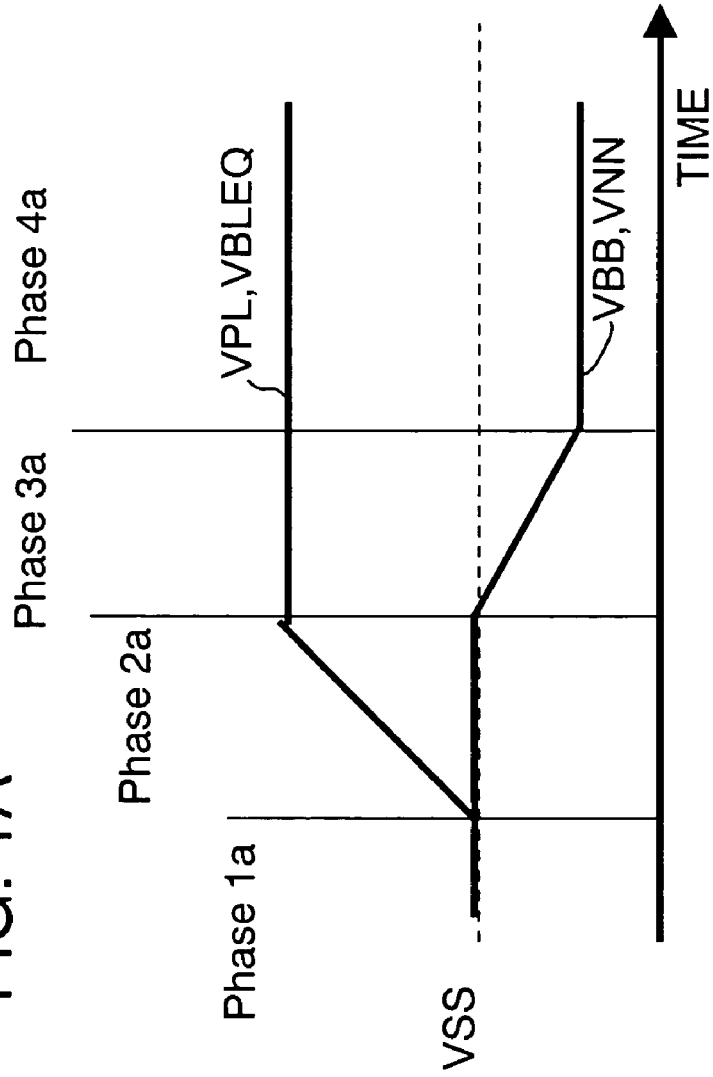
Figure 2:
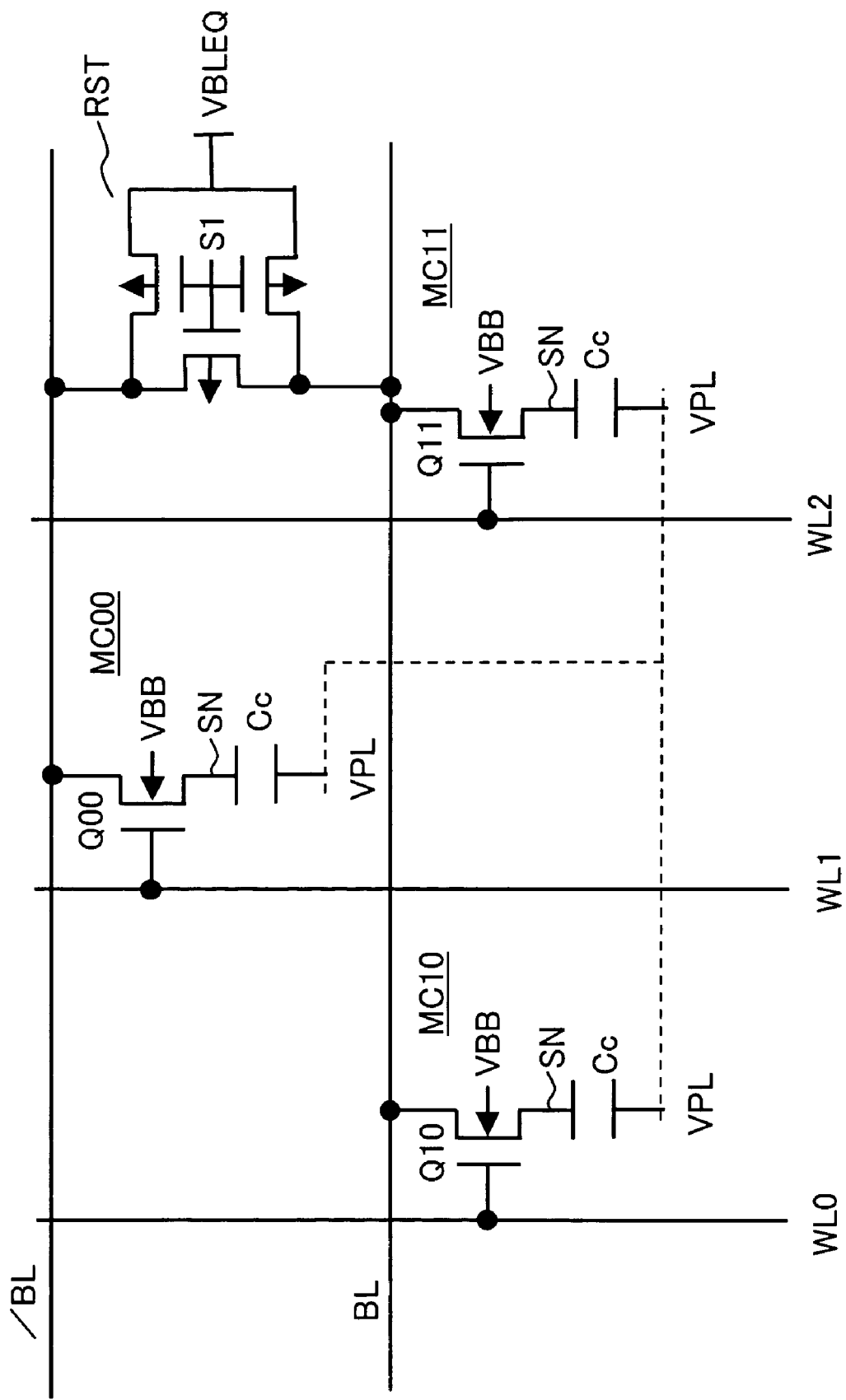
FIG. 2 is a circuit diagram of a semiconductor memory constituting an example of the semiconductor integrated circuit device of this embodiment.

FIG. 2 is a circuit diagram of a semiconductor memory constituting an example of the semiconductor integrated circuit device of this embodiment. This example is a DRAM circuit diagram in which a plurality of word-lines WL0 to WL2 are arranged to intersect a plurality of bit lines BL, /BL and in which memory cells MC00, MC10, and MC11 are arranged at the points of intersection between the bit lines and word lines. Each memory cell comprises cell transistors Q00, Q10, Q11 respectively and a cell capacitor Cc. The back gate regions of the cell transistors Q are connected to the back gate bias power supply VBB and the cell plate, which is an opposite electrode to the storage node SN of the cell capacitor Cc, is connected to the cell plate power supply VPL. These memory cells are provided in a common memory core region and the cell plate region is constituted by a common region as indicated by the broken line, for example. Further, a bitline pre-charge equalizer circuit RST is provided on the bit line pair BL, /BL, the transistors therein conduct in accordance with a reset signal S1, and the bit line pair BL, /BL is thus connected to the bitline pre-charge power supply VBLEQ. Further, the word-lines WL0 to WL2 are driven by a wordline driver circuit (not shown) and the non-select reset potential for the word line is driven to a negative potential (word line reset potential) and the select potential for the word line is driven to a positive potential during selection, for example.

Figure 3B:
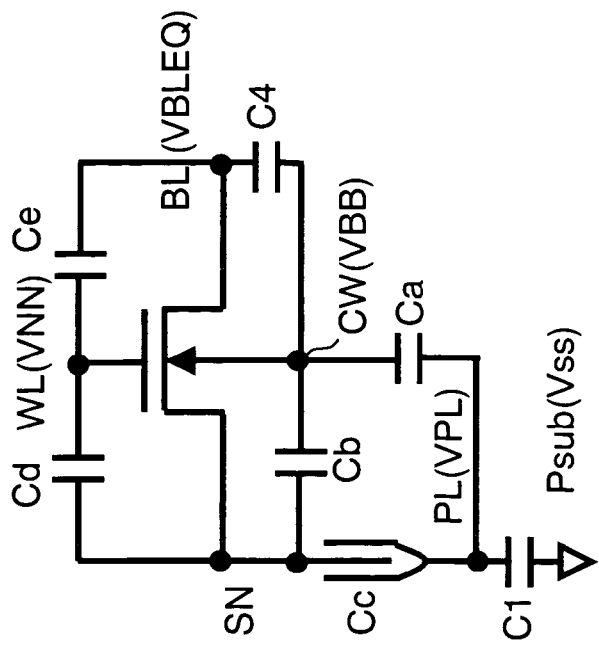
FIG. 3 shows the cross-sectional structure of the memory cell of the semiconductor memory of this embodiment and the capacitance network thereof.
Figure 3A:
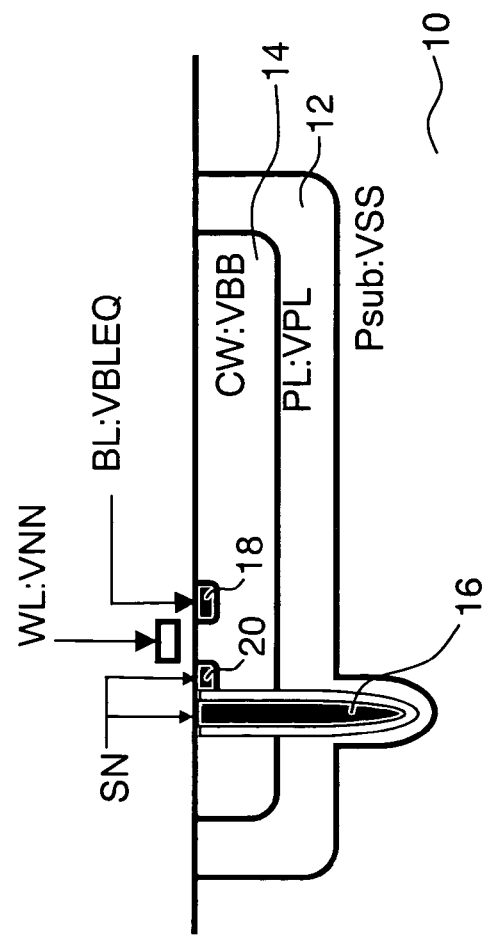

FIG. 3 shows the cross-sectional structure of the memory cell of the semiconductor memory of this embodiment and the capacitance network thereof. FIG. 3A is a cross-sectional view thereof and FIG. 3B is a capacitance network diagram. The semiconductor memory is constituted such that an N-type well region 12 is formed in a P-type semiconductor substrate 10 and a P-type cell well region 14 is formed in the N-type well region 12. Further, the source region 18 and drain region 20 that constitute a cell transistor are formed in the P-type cell well region 14 and the gate electrode is a word-line WL. One source-drain region 18 is connected to the bit line BL, while the other source-drain region 20 is a storage node SN and is connected to a trench-capacitor electrode 16. The trench capacitor comprises the electrode 16, which is formed via an insulation film in the cell well region 14 and N-type well region 12.

Therefore, the N well region 12 is a cell plate region to which the cell plate power supply VPL constituting a positive internal power supply is applied. Further, the P-type cell well region 14 is a cell transistor back gate region connected to the back gate bias power supply VBB, which is a negative internal power supply. The ground power supply VSS is also applied to the P-type substrate 10. Thus, an internal power supply is connected to each region so that the PN junction between the P-type substrate 10 and the N-type cell plate region 12 and the PN junction between the N-type cell plate region 12 and P-type cell well region 14 are reverse-biased.

In the capacitance network diagram shown in FIG. 3B, the capacitance C1 between the cell plate PL and substrate Psub corresponds to the PN junction capacitance between the cell plate region 12 and substrate 10, the capacitance Cc between the storage node SN and cell plate PL corresponds to the cell capacitor between the electrode 16 and cell plate region 12, the capacitance Cb between the storage node SN and cell well CW corresponds to the capacitance between the electrode 16 and the cell well region 14, the capacitance Ca between the cell plate PL and cell well CW corresponds to the PN junction capacitance between the cell plate region 12 and cell well region 14, the capacitance C4 between the cell well CW and bitline BL corresponds to the PN junction capacitance between the cell well region 14 and source-drain region 18, and the capacitance Cd between the gate WL constituting a word-line and the storage node SN and capacitance Ce between the gate WL and bitline BL correspond to the capacitance between the gate of the cell transistor and the source region 18 and drain region 20.

Further, the large-area cell plate region 12 and cell well region 14 are formed overlapping one another within the memory core and a plurality of the trench-capacitor electrode 16 is provided in correspondence with the memory cells in the cell plate region 12 and cell well region 14 respectively. Therefore, the surface area of the cell plate region 12 and cell well region 14 increases as the memory capacity increases and the capacitance values of the capacitances Ca, Cb and Cc shown in the capacitance network also increase. Therefore, in order to step down the back gate bias power supply VBB connected to the cell well region 14 to a predetermined negative potential, these capacitances must be charged and, when the memory capacity increases, there is a necessity to also increase the driving capability of the VBB negative power supply generation circuit for the purpose of this step-down. Meanwhile, since an active current does not flow to the cell well region 14 during standby, the VBB negative power supply generation circuit may have a relatively small driving capability that is of a magnitude to absorb voltage fluctuations caused by leak current from the source region 18 and drain region 20.

Meanwhile, the cell well region 14 connected to the back gate bias power supply VBB is connected to the cell plate region 12 (PL) via the relatively large junction capacitances Ca, Cb, and Cc and is connected via the junction capacitance C4 to the source-drain region 18 to which the bitline BL is connected. There is also a tendency for the junction capacitances to increase with increased memory capacity.

Figure 4B:
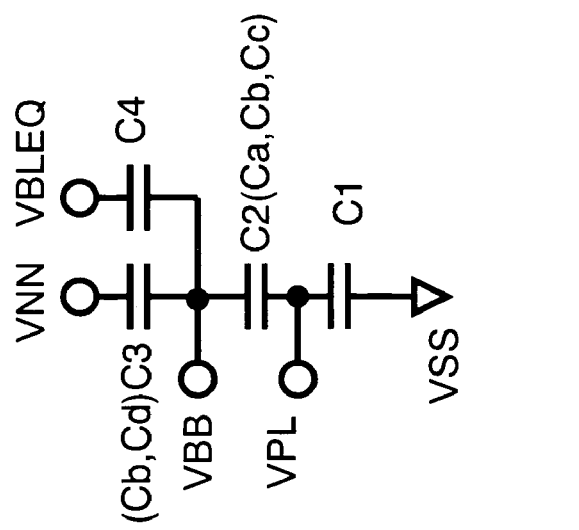
FIG. 4 shows the power supply startup method of this embodiment.
Figure 4A:
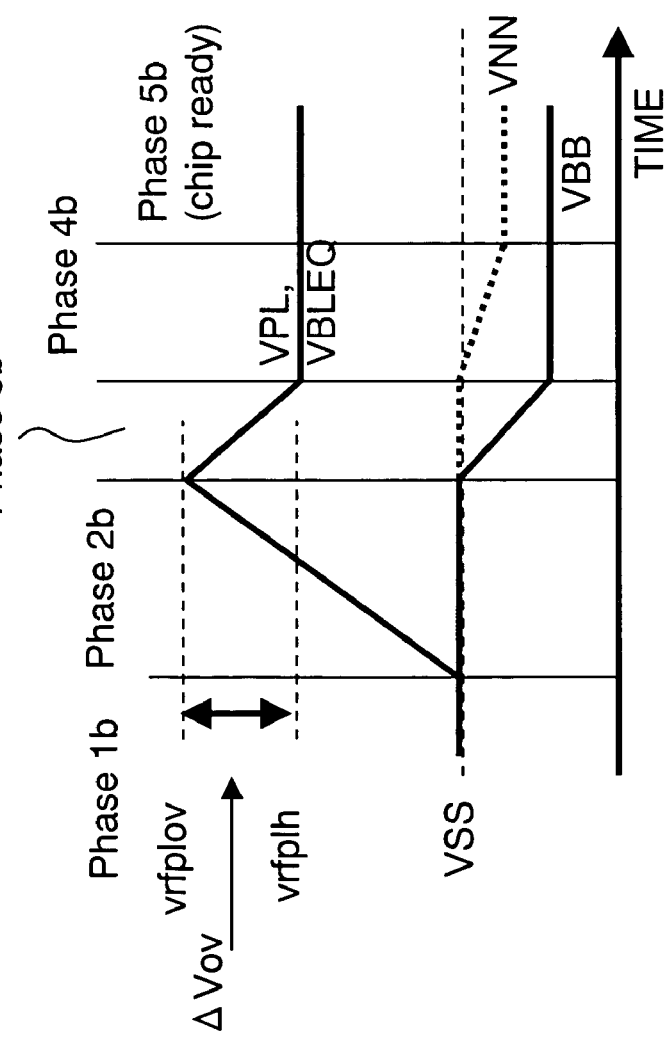

FIG. 4 shows the power supply startup method of this embodiment. FIG. 4A shows the variation in each power supply voltage during power supply startup, where the horizontal axis represents time and the vertical axis represents the voltage. Further, FIG. 4B is a capacitance network diagram that shows capacitances such as junction capacitances, parasitic capacitances, and so forth, between respective internal power supplies.

According to the power supply startup sequence of this embodiment, in phase 1b, the internal step-down power supply, internal booster power supply, and a variety of reference voltages are started at respective potentials in response to the rise in the external power supply VDD that accompanies the power supply startup. During this interval, other internal power supplies are clamped at the clamping potential VSS. Further, in phase 2b, while the back gate bias power supply VBB and the wordline reset power supply VNN, which are negative internal power supplies, are clamped at the clamping potential VSS, the cell plate power supply VPL and bitline pre-charge power supply VBLEQ, which are positive internal power supplies, are overdriven to an overdrive potential vrfplov that exceeds the normal potential Vrfplh of the positive internal power supply by a predetermined voltage (overdrive amount) ΔVov. The overdrive is performed by using the external power supply VDD by means of the cell plate power supply generation circuit and so forth. Further, in phase 3b, the clamping of the back gate bias power supply VBB, which is a negative internal power supply, to the ground potential VSS is canceled and the cell plate power supply VPL and bitline pre-charge power supply VBLEQ, which are positive internal power supplies, drop to the normal potential Vrfplh. As a result, the back gate bias power supply VBB of the cell well region 14, which is coupled to the cell plate region and bit line region via the capacitances C2 and C4 respectively, drops from the clamping potential VSS as a result of capacitance coupling and reaches the desired negative internal power supply potential. After phase 3b or subsequently, the back gate bias power supply generation circuit starts up and the potential of the back gate bias power supply VBB is held at the desired negative potential by means of the power supply generation circuit.

Finally, when the drop in the back gate bias power supply VBB ends, the wordline reset power supply VNN is pulled down to a potential that is lower than the clamping potential VSS in phase 4b. Startup of the power supply VNN is performed as a result of pumping driving by the wordline reset power supply generation circuit, for example. When startup of these internal power supplies ends, the standby state is assumed in phase 5b and an operation to access the memory is started.

According to the internal power supply startup method above, when the cell plate power supply VPL and bitline pre-charge power supply VBLEQ are started up, same are overdriven above the normal potential vrfplh of these power supplies. By pulling the cell plate power supply VPL and bitline pre-charge power supply VBLEQ down from the overdrive potential toward the normal potential when starting up the back gate bias power supply VBB, which is a negative internal power supply, the back gate bias power supply VBB can be stepped down by means of capacitance coupling. Therefore, the driving capability at power supply startup can be enhanced without raising the driving capability of the back gate bias power supply generation circuit and the negative internal power supply can be started up in a short time. A positive internal power supply such as a cell plate power supply can be stepped up by using an external power supply VDD or the like and, because a pumping circuit such as a negative power supply is not necessary, an excessive amount of time is not required for the overdrive.

Further, by suitably designing the level of the overdrive potential vrfplov in accordance with the size of the coupling capacitances C2 and C4, the back gate bias power supply VBB can be stepped down to the desired negative potential as a result of the step-down of the cell plate power supply VPL and bitline pre-charge power supply VBLEQ.

In the above example, although, in phase 2b, the bitline pre-charge power supply VBLEQ is overdriven in addition to the cell plate power supply VPL, only either one may be overdriven. However, in consideration of the size of the coupling capacity of the cell well region 14 to which the back gate bias power supply VBB is connected, it is more effective to overdrive the cell plate power supply VPL and use same in the step-down of the back gate bias power supply VBB.

Further, in the example above, although the back gate bias power supply VBB is stepped down as a result of the step-down of the positive internal power supply VPL, VBLEQ, the wordline reset power supply VNN may also be similarly stepped down. Alternatively, only the wordline reset power supply VNN may be stepped down by means of capacitance coupling. In this case, the bitline pre-charge power supply VBLEQ, which is directly capacitance-coupled to the word-lines WL, is preferably also overdriven and stepped down.

In addition, in the internal power supply startup sequence, in phase 3b, only the cell plate power supply VPL may be stepped down so that the back gate bias power supply VBB is stepped down through capacitance coupling and, in phase 4b, the bitline pre-charge power supply VBLEQ may be stepped down from the overdrive potential so that the wordline reset power supply VNN is stepped down through capacitance coupling.

In either case, by stepping down the positive internal power supply by canceling the clamping of the negative internal power supply once the positive internal power supply has been overdriven so as to step down the negative internal power supply by means of capacitance coupling, the driving capability of the negative internal power supply generation circuit can be enhanced at power supply startup. Accordingly, there is no need to make the driving capability of the negative internal power supply generation circuit as large and the size of the pumping capacitor of the pumping circuit can be reduced.

Figure 5:
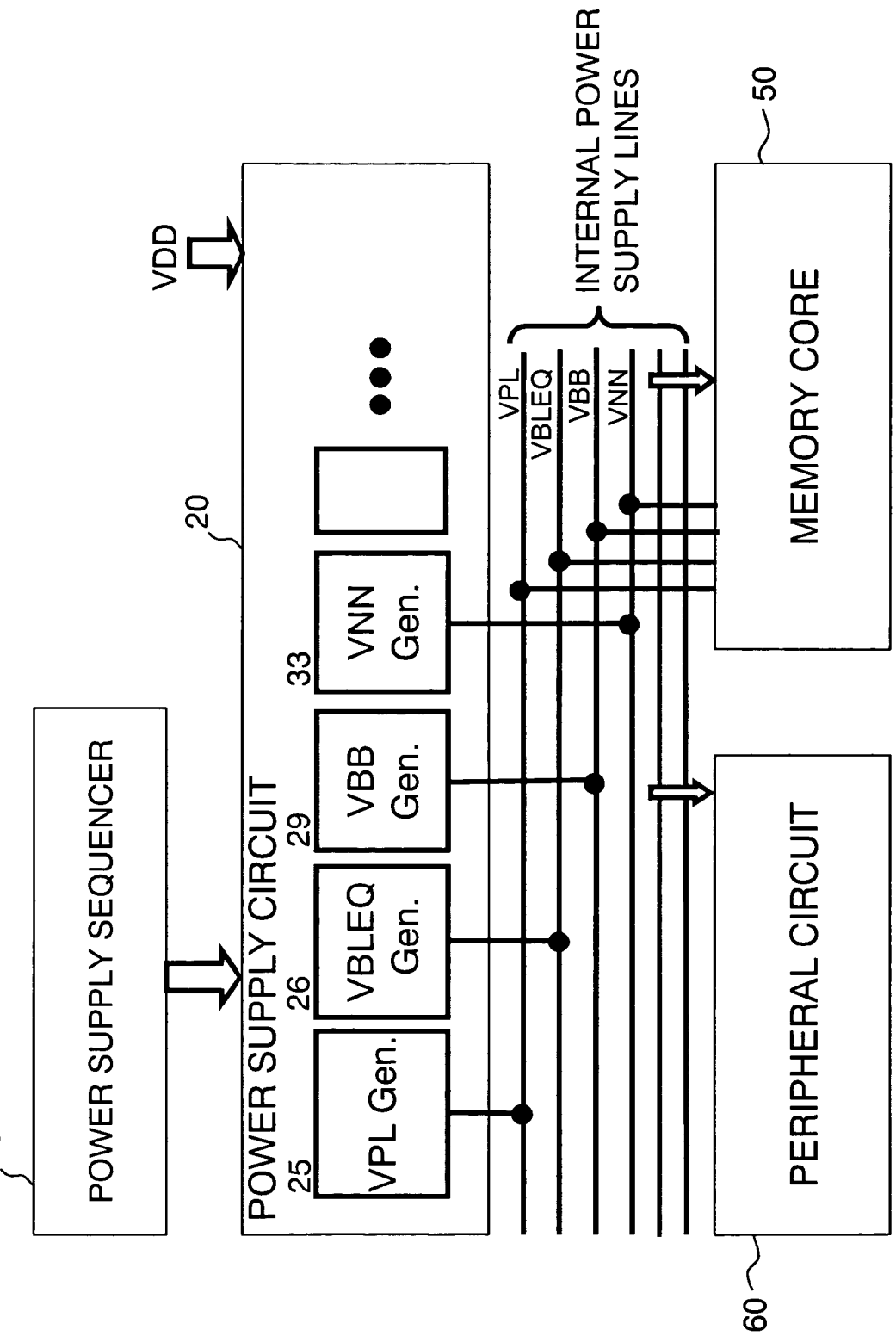
FIG. 5 is a constitutional view of the semiconductor memory of this embodiment.

FIG. 5 is a constitutional view of the semiconductor memory of this embodiment. The semiconductor memory comprises the memory core 50 having the memory cells shown in FIG. 3 and the peripheral circuit 60, to which the required power is supplied in each case from the internal power supplies VPL, VBLEQ, VBB, and VNN, and so forth. Further, a power supply circuit group 20, which comprises the internal power supply generation circuits 25, 26, 29, and 33, and so forth, which generate the above internal power supplies, is provided, and the power supply circuit group 20 is drive-controlled by means of a power supply sequencer circuit 40 at power supply startup. The internal power supply generation circuits include a cell plate power supply generation circuit 25, a bitline pre-charge power supply generation circuit 26, a back gate bias power supply generation circuit 29, and a wordline reset power supply generation circuit 33, and so forth.

Figure 6:
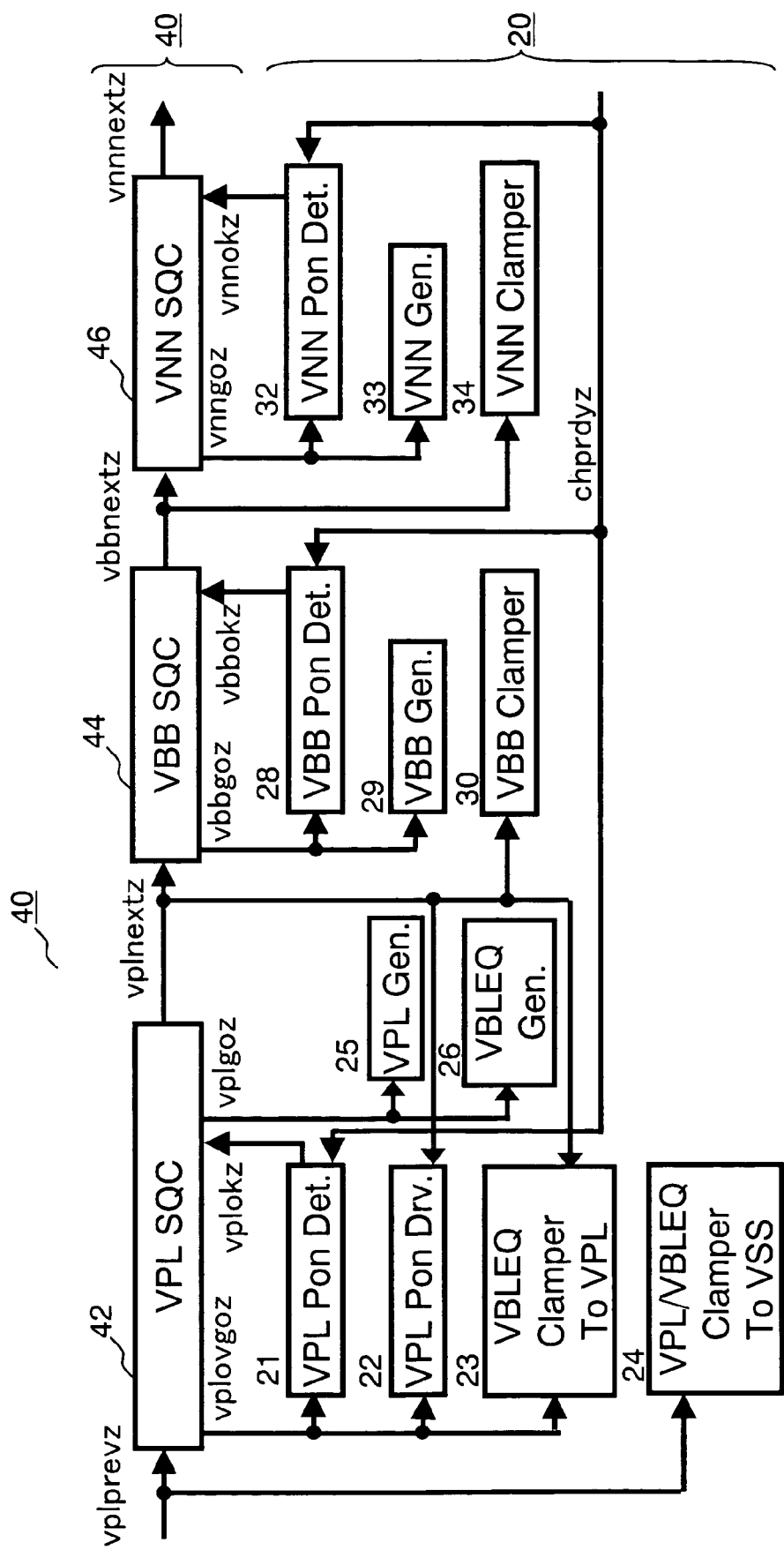
FIG. 6 is a block diagram of the power supply sequencer and power supply circuit of this embodiment.
Figure 7:
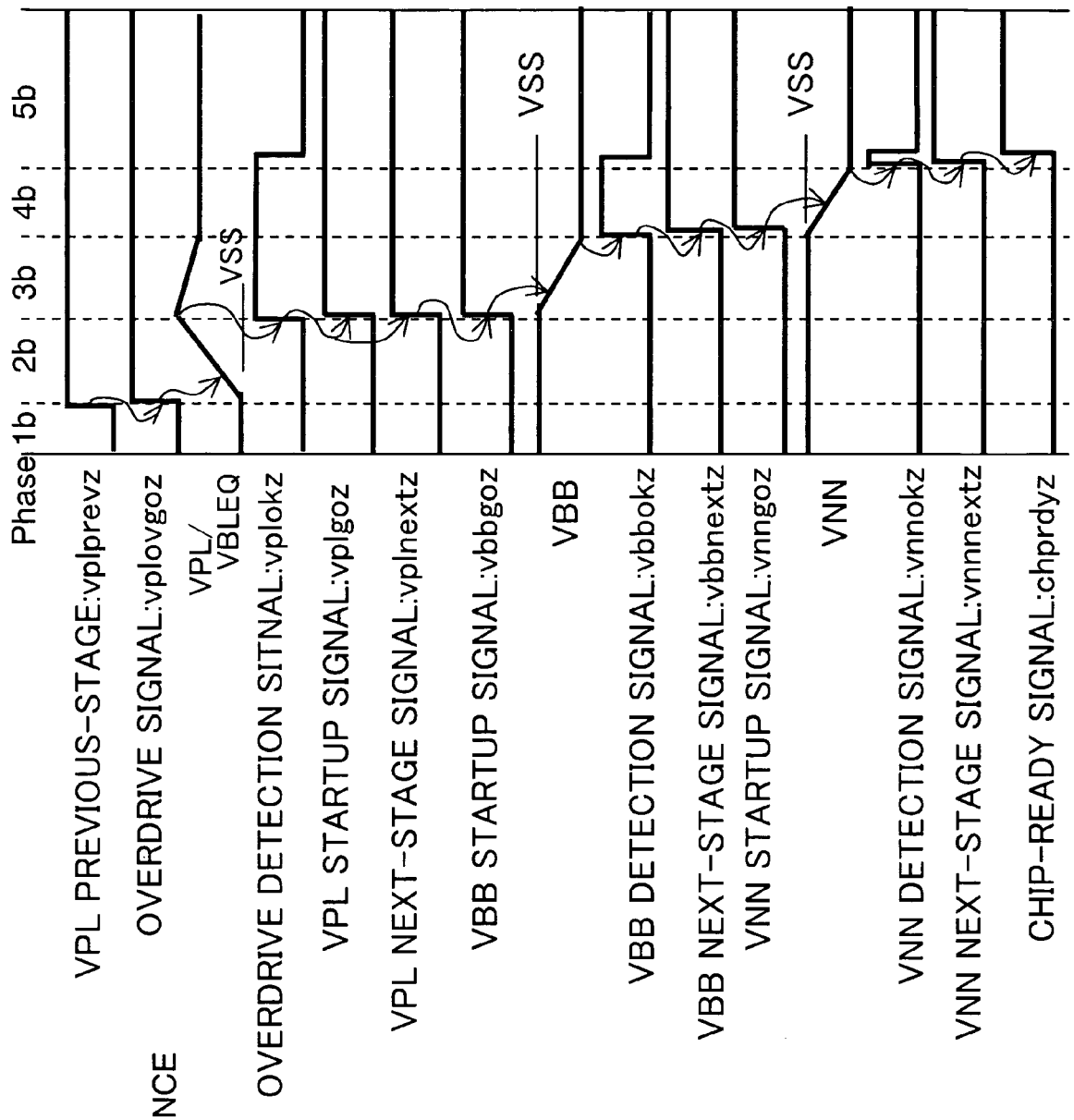
FIG. 7 is a waveform diagram of the power supply startup sequence of this embodiment.

FIG. 6 is a block diagram of the power supply sequencer and power supply circuits of this embodiment and FIG. 7 is a waveform diagram of the power supply startup sequence thereof. In addition, FIG. 8 is a power supply startup sequence diagram. The power supply sequence of this embodiment will be described in detail with reference to these figures and FIG. 4A. Further, each circuit of the block diagram in FIG. 6 will be described in detail subsequently.

As shown in the block diagram of FIG. 6, the power supply sequencer 40 comprises a VPL sequencer 42, a VBB sequencer 44, and a VNN sequencer 46, where the sequencers 42, 44, and 46 control the startup of the cell plate power supply VPL, the startup of the back gate bias power supply VBB, and the startup of the wordline reset power supply VNN respectively.

In phase 1b, startup of the internal power supply, that rises before the cell plate power supply VPL, is performed. Here, the cell plate power supply VPL and bit-line pre-charge power supply VBLEQ are connected and clamped to the clamping potential VSS by means of a damper 24. When startup of the internal power supply required in phase 1b ends, the VPL previous-stage signal vplprevz is then at a high level and the damper 24 is disabled, whereby the clamping is canceled.

In phase 2b, in response to the high level of the VPL previous-stage signal vplprevz, the VPL sequencer 42 sets the overdrive signal vplovgoz at the high level and enables the VPL startup driver circuit 22 and VPL startup detection circuit 21. Further, the damper 23, which connects the bit-line pre-charge power supply VBLEQ to the cell plate power supply VPL, is also enabled and the cell plate power supply VPL and bit-line pre-charge power supply VBLEQ are also overdriven.

However, when the bit-line pre-charge power supply VBLEQ is not overdriven, the damper 23 is not enabled, the power supply VBLEQ is not connected to the power supply VPL, and, in phase 2b, the VBLEQ power supply generation circuit 26 is enabled and started up VBLEQ at a predetermined potential.

In phase 2b, a VBB damper 30 and VNN damper 34 are enabled and the negative power supplies VBB and VNN are both connected and clamped to the ground potential VSS. The power supplies VPL and VBLEQ are both overdriven by means of the VPL startup driver circuit 22 and, upon reaching the level of the predetermined overdrive potential vrfplov, the VPL startup detection circuit 21 detects this fact and sets the overdrive detection signal vplokz at the high level. In response to the high level of the overdrive detection signal vplokz, the VPL sequencer 42 sets the VPL startup signal vplgoz and VPL next-stage signal vplnextz at the high level. In response to the high level of the VPL next-stage signal vplnextz, the VPL startup circuit 22 and clamper 23 are disabled and the overdrive of the power supplies VPL and VBLEQ ends.

The VPL startup driver circuit 22 overdrives the cell plate power supply VPL by means of an external power supply VDD, and the VPL power supply generation circuit 25 holds the cell plate power supply VPL at a predetermined potential, as described subsequently. However, the overdrive function of the VPL startup driver circuit can be one function of the VPL power supply generation circuit 25. That is, in this case, a positive internal power supply generation circuit is formed by the combined usage of the VPL startup driver circuit 22 and the VPL power supply generation circuit 25.

In phase 3b, in response to the high level of the VPL startup signal vplgoz, the VPL power supply generation circuit 25 and VBLEQ power supply generation circuit 26 are enabled. The power supply generation circuits 25 and 26 have, as will be described subsequently, the function of holding the respective power supplies VPL and VBLEQ in the range of a predetermined normal potential and, as a result of this function, the power supplies VPL and VBLEQ are stepped down from the overdrive potential vrfplov to the original normal potential. In response to the step-down operation, the back gate bias power supply VBB is stepped down to the negative potential as a result of capacitance coupling. In addition, the VBB sequencer 44 sets the VBB startup signal vbbgoz at the high level and, by way of response, the VBB power supply generation circuit 29 and VBB startup detection circuit 28 are enabled. Therefore, the back gate bias power supply VBB is stepped down by means of capacitance coupling as a result of the step-down of the power supplies VPL and VBLEQ and is also stepped down as a result of the pumping operation of the VBB power supply generation circuit 29. Further, upon detecting that the power supply VBB has reached a predetermined negative potential, the VBB startup detection circuit 28 sets the VBB detection signal vbbokz at the high level. In response to the VBB detection signal vbbokz, the VNN sequencer 46 sets the VBB next-stage signal vbbnextz at the high level. In response to this VBB next-stage signal vbbnextz, the VNN damper 34 cancels the connection of the power supply VNN to the ground potential VSS. As shown in FIG. 8, this cancellation may be done in response to the VBB startup signal vbbgoz during startup in phase 3b. In this case, the wordline reset power supply VNN is also stepped down through capacitance coupling along with the back gate bias power supply VBB.

In phase 4b, in response to the high level of the VBB next-stage signal vbbnextz the VNN sequencer 46 sets the VNN startup signal vnngoz at the high level and enables the VNN power supply generation circuit 33 and VNN startup detection circuit 32. The VNN power supply generation circuit 33 is a pumping circuit employing a hopping capacitor that reduces the wordline reset power supply VNN to a predetermined negative potential. Further, upon detecting that the power supply VNN has reached the predetermined negative potential, the VNN startup detection circuit 32 sets the VNN detection signal vnnokz at the high level, whereupon the VNN sequencer 46 sets the VNN next-stage signal vnnnextz at the high level by way of response. The word-line reset power supply VNN is such that the parasitic capacitance to be charged is smaller than the back gate bias power supply VBB and can be stepped down in a relatively short time by means of the pumping circuit.

In phase 5b, in response to the high level of the VNN next-stage signal vnnnextz, a circuit (not shown) sets a chip-ready signal chprdyz at the high level. Next, in response to the chip-ready signal chprdyz, the startup detection circuits 21, 28 and 32 are disabled. However, the disabling of these detection circuits may be performed each time the respective detection signals of the detection circuits have been produced, as shown in FIG. 8. Hereinabove, the startup of the internal power supplies VPL, VBLEQ, VBB, and VNN is completed.

Each of the circuits shown in the block diagram in FIG. 6 will be described hereinbelow.

Figure 9:
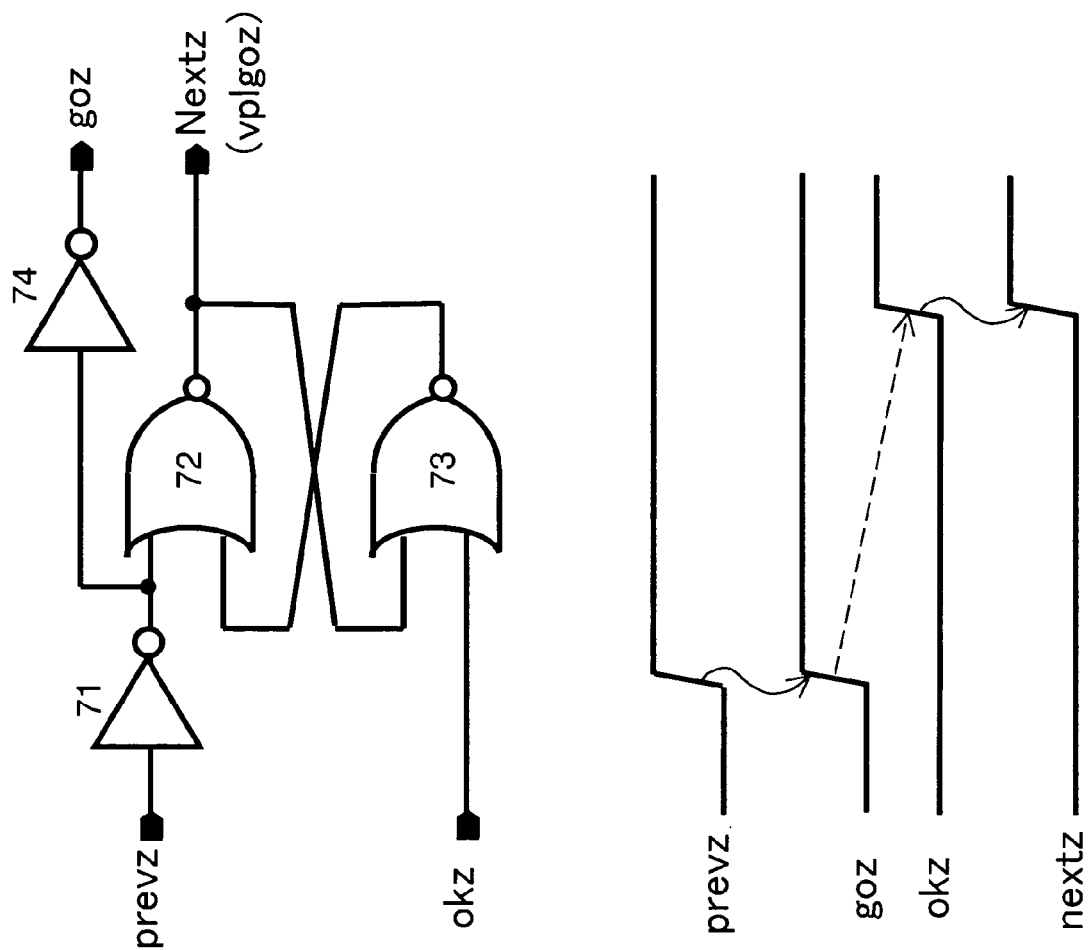
FIG. 9 shows a circuit diagram and operation waveform diagram of the sequencer circuit of this embodiment.

FIG. 9 shows a circuit diagram and operation waveform diagram of the sequencer circuit of this embodiment and may also be applied to any of the VPL sequencer 42, VBB sequencer 44, and VNN sequencer 46 in FIG. 6. As shown in the operation waveform diagram in FIG. 9, when the previous-stage signal prevz is at the high level, the startup signal goz is set at the high level via inverters 71 and 74. Here, the latch circuit, which comprises the NOR gates 72 and 73, does not invert signals and hence the next-stage signal nextz remains at the low level. In response to the startup signal goz, the corresponding power supply startup circuit or power supply generation circuit is enabled and, when the startup of the corresponding power supply is complete, the detection signal okz is at the high level. By way of response, the output of the NOR gate 73 is then at the low level, the two inputs of the NOR gate 72 are at the low level, and the subsequent signal nextz is at the high level.

Further, in a case where the sequencer circuit of FIG. 9 is applied to the VPL sequencer 42, the next-stage signal nextz and VPL startup signal vplgoz are also outputted from the NOR gate 72.

Figure 10:
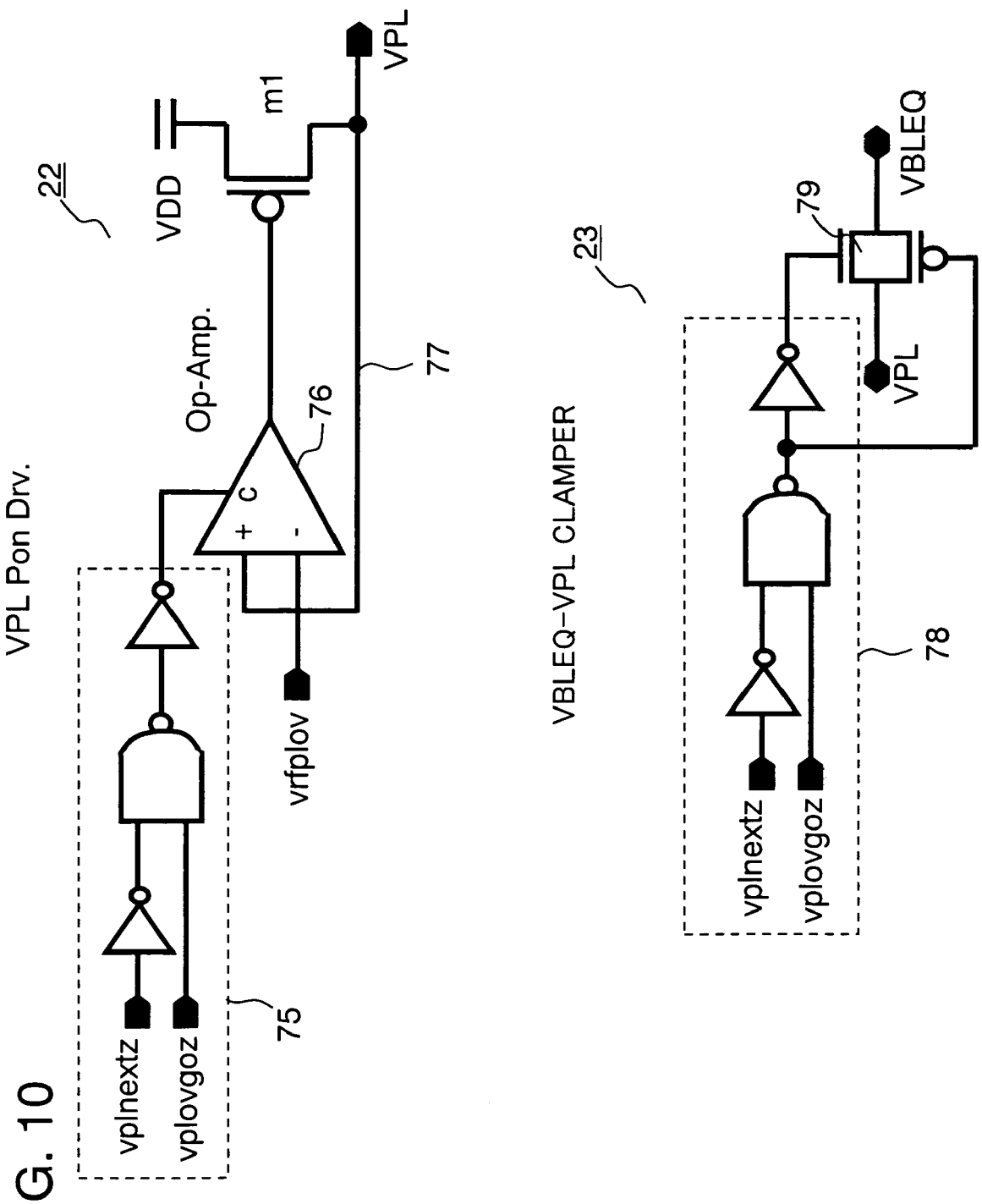
FIG. 10 is a circuit diagram of a VPL startup driver circuit 22 and VBLEQ-VPL damper 23.

FIG. 10 is a circuit diagram of a VPL startup driver circuit 22 and VBLEQ-VPL clamper 23. The VPL startup driver circuit 22 is constituted by a logic circuit 75, which adopts the logic of the VPL next-stage signal vplnextz and overdrive signal vplovgoz, and an operational amplifier comprising a differential amplifier 76, a P-channel transistor m1, and a feedback circuit 77. As shown in FIG. 7, in response to the high level of the overdrive signal vplovgoz, the differential amplifier 76 enters the enabled state and the output of the differential amplifier 76 causes the transistor m1 to conduct, whereby the cell plate power supply VPL is driven by means of the external power supply VDD. Further, when the power supply VPL reaches the overdrive potential vrfplov that is inputted to the inverting input terminal of the differential amplifier 76, the differential amplifier 76 enters a balanced state and the driving by the transistor m1 is stopped. That is, because the level of the overdrive potential vrfplov is lower than that of the external power supply VDD, the power supply VPL can be driven to the level of the overdrive potential vrfplov within a relatively short time simply by driving the power supply VPL by means of the transistor m1.

The VBLEQ-VPL clamper 23 is constituted by a logic circuit 75 that adopts the logic of the VPL next-stage signal vplnextz and the overdrive signal vplovgoz and the CMOS transfer gate 79. The logic circuit 75 is the same as the VPL startup driver and, in the same period, the power supply VBLEQ is connected to the power supply VPL and the power supply VBLEQ is driven in conjunction with the overdrive of the power supply VPL.

The VPL startup driver circuit 22 and VBLEQ-VPL clamper 23 are both disabled when the VPL next-stage signal vplnextz is at the high level and the outputs of the logic circuits 75 and 78 are at the low level.

Figure 11:
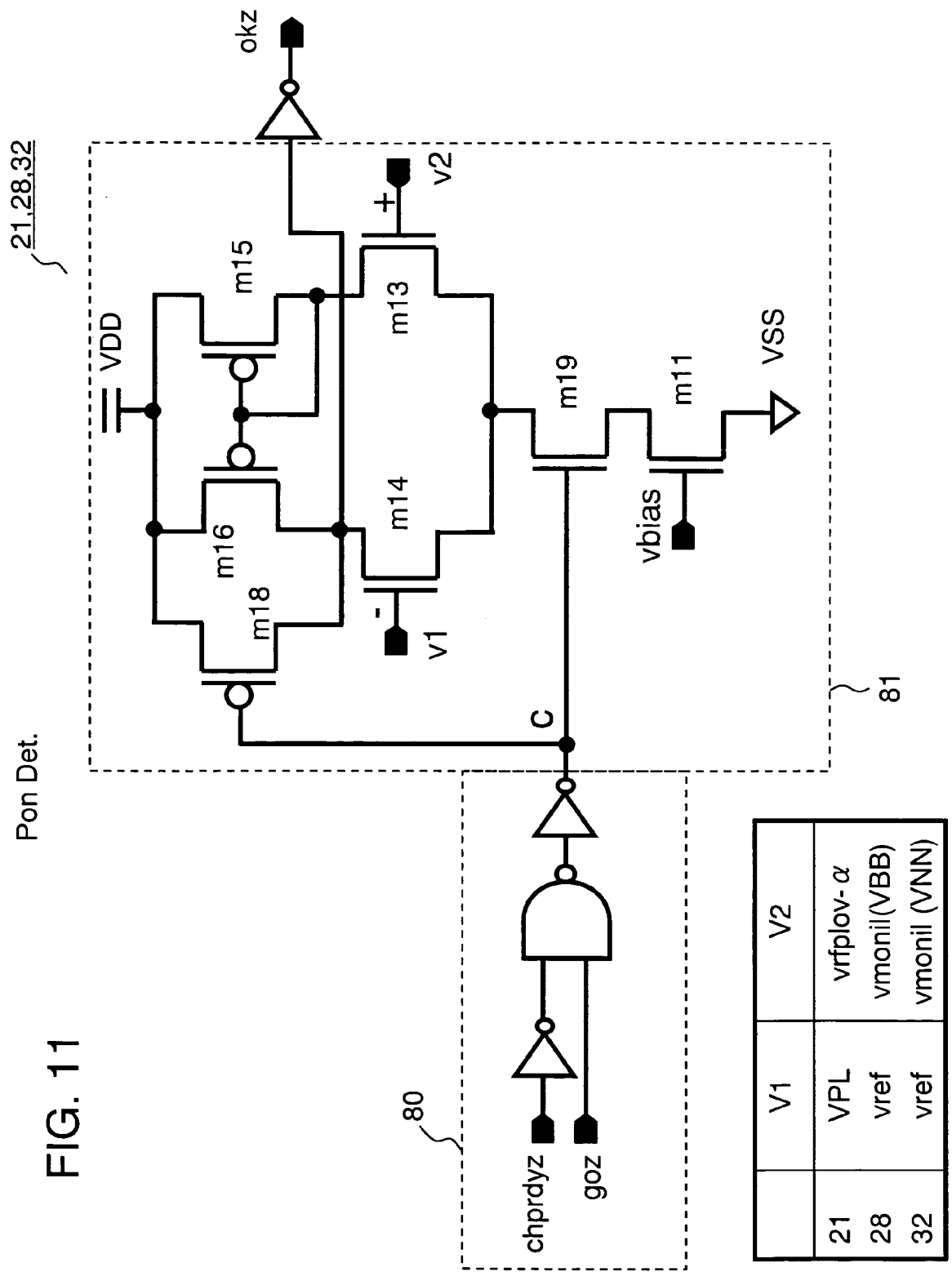
FIG. 11 is a circuit diagram of startup detection circuits 21, 28 and 32.

FIG. 11 is a circuit diagram of startup detection circuits 21, 28 and 32. The startup detection circuits are constituted by a control logic circuit 80, which adopts the logic of the startup signal goz and chip-ready signal chprdyz, and a CMOS differential amplifier 81. The CMOS differential amplifier 81 is constituted by transistors m11 to m18 and the detected power supply is applied to input V1 or V2 while a detection reference voltage is applied to input V2 or V1. Further, when input V1 is higher than input V2, the transistor m14 conducts and the detection signal okz is set at the high level.

For example, in the case of the VPL startup detection circuit 21, as shown in the table in FIG. 11, the detected power supply VPL is inputted to input V1 while vrfplov-a, which is slightly lower than the overdrive reference potential vrfplov, is inputted to input V2. As a result, when the power supply VPL reaches the reference potential vrfplov-a as a result of the VPL startup driver in FIG. 10, the overdrive detection signal vplokz is set at the high level. Further, the reason for inputting vrfplov-a, which is slightly lower than the overdrive reference potential vrfplov, to input V2 is so that the detection signal okz can be reliably outputted even when an offset voltage exists in the differential amplifier 81. That is because the VPL startup driver circuit 22 stops the driving when the power supply VPL exceeds the overdrive reference potential vrfplov, therefore, if an offset voltage exists in the differential amplifier 81, in cases where the potential of input V1 does not exceed a potential that is below the potential of the reference input V2 to the extent of the offset voltage, the detection signal okz cannot be suitably outputted.

In the case of the VBB startup detection circuit 28, the monitor voltage vmonil of the detected power supply VBB that is outputted by the VBB power supply generation circuit, which will be described subsequently, is inputted to the input V2 and the reference potential vref is inputted to the input V1. Further, when the monitor voltage vmonil of the detected power supply VBB drops to the reference potential, the detection signal okz is at the high level. So too in the case of the VNN startup detection circuit 32, the monitor voltage of the detected power supply VNN is similarly inputted to the input V2 and the reference potential vref is inputted to the input V1. Further, when the monitor voltage of the detected power supply VNN drops to the reference potential, the detection signal okz is at the high level.

Figure 12B:
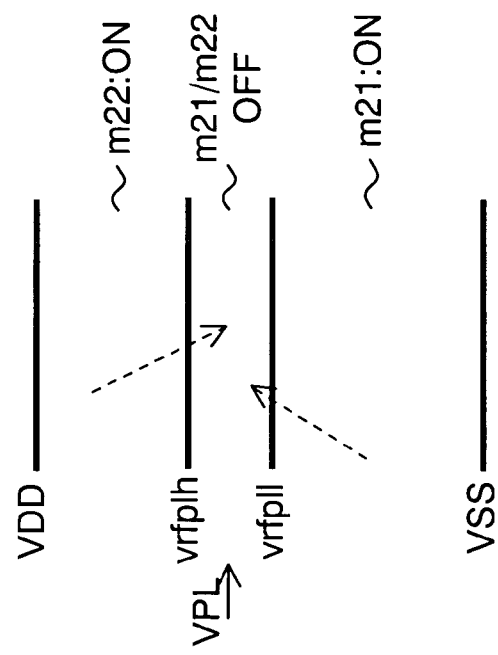
FIG. 12 is a circuit diagram of the VPL power supply generation circuit.
Figure 12A:
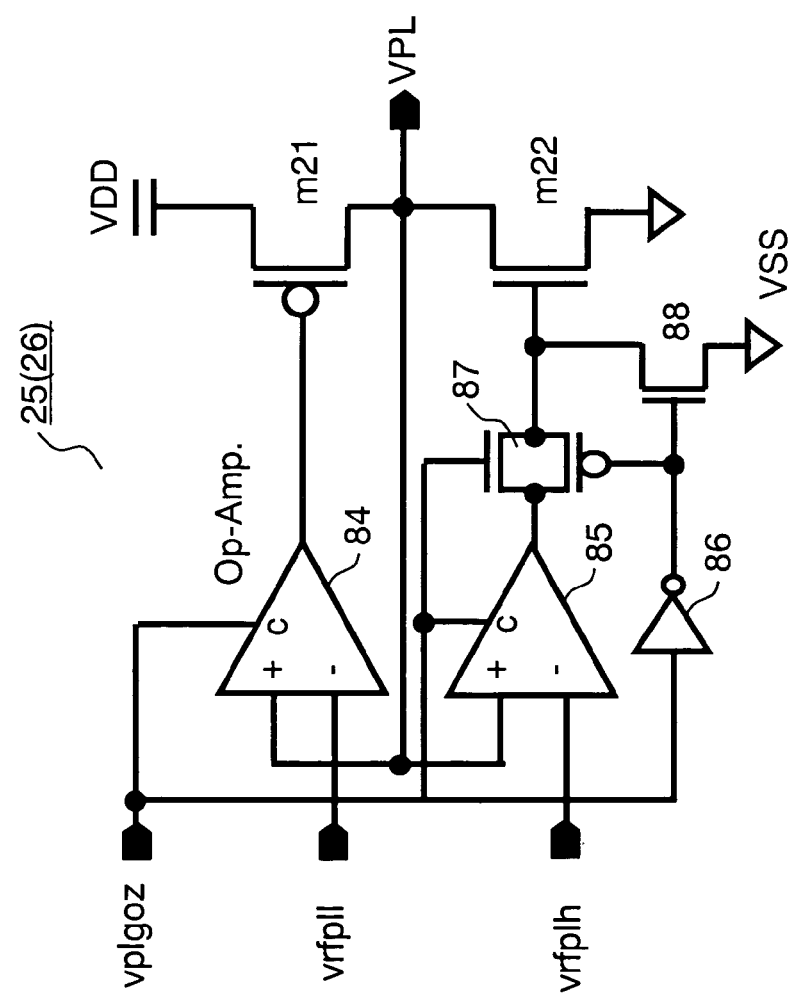

FIG. 12 is a circuit diagram of the VPL power supply generation circuit. FIG. 12A is a circuit diagram and FIG. 12B shows the power supply level. The cell plate power supply VPL is an intermediate potential between the ground power supply VSS and the external power supply VDD. Further, the cell plate power supply VPL must be held at a predetermined potential level. Therefore, the VPL power supply generation circuit 25 has a constitution in which the gates of the push-pull transistors m21, m22 are driven by the outputs of the differential amplifiers 84 and 85 respectively. That is, the differential amplifiers 84 and 85 are enabled by means of the high level of the VPL startup signal vplgoz and, when the power supply VPL is lower than the low reference voltage vrfpll, the output of the differential amplifier 84 is at the low level, whereby the P-channel transistor m21 is driven and the power supply VPL is pulled up to the reference voltage vrfpll. Meanwhile, when the power supply VPL is higher than the high reference voltage vrfplh, the output of the differential amplifier 85 is at the high level, whereby the N-channel transistor m22 is driven and the power supply VPL is pulled down to the reference voltage vrfplh. Further, when the power supply VPL is at a level between the two reference voltages vrfplh and vrfpll (dead zone), the output of the differential amplifiers 84 and 85 are at the high level and low level respectively, meaning that the two transistors m21 and m22 are turned off and the power supply VPL is at a high impedance state.

Further, an inverter 86, transfer gate 87, and transistor 88 are provided so that, while the VPL startup signal vplgoz is at the low level, the transistor 88 is turned ON and m22 is turned OFF and, in phase 2b, the transistor m22 does not operate even when the power supply VPL is overdriven.

Further, when, in phase 3b, the VPL startup signal vplgoz is at the high level, the transistor m22 is ON and the power supply VPL is stepped down to the predetermined normal level vrfplh. As a result of the step-down operation of the VPL power supply generation circuit, the power supply VPL is pulled down and the negative power supplies VBB and VNN, and so forth, can be stepped down by means of capacitance coupling.

The VBLEQ power supply generation circuit 26 is also constituted by the same circuit.

Figure 13A:
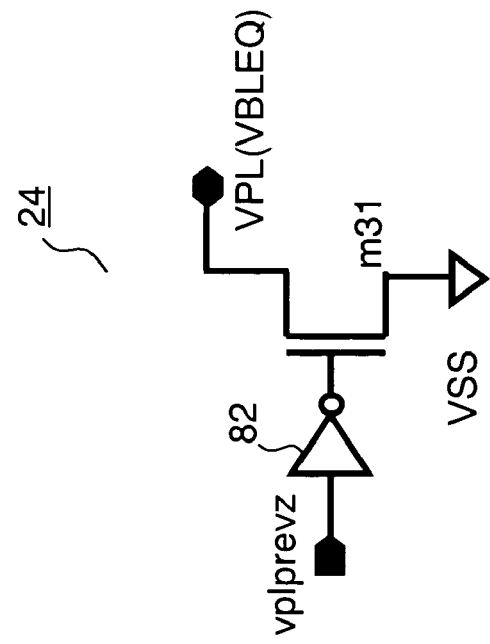
FIG. 13 is a circuit diagram of a damper circuit.
Figure 13B:
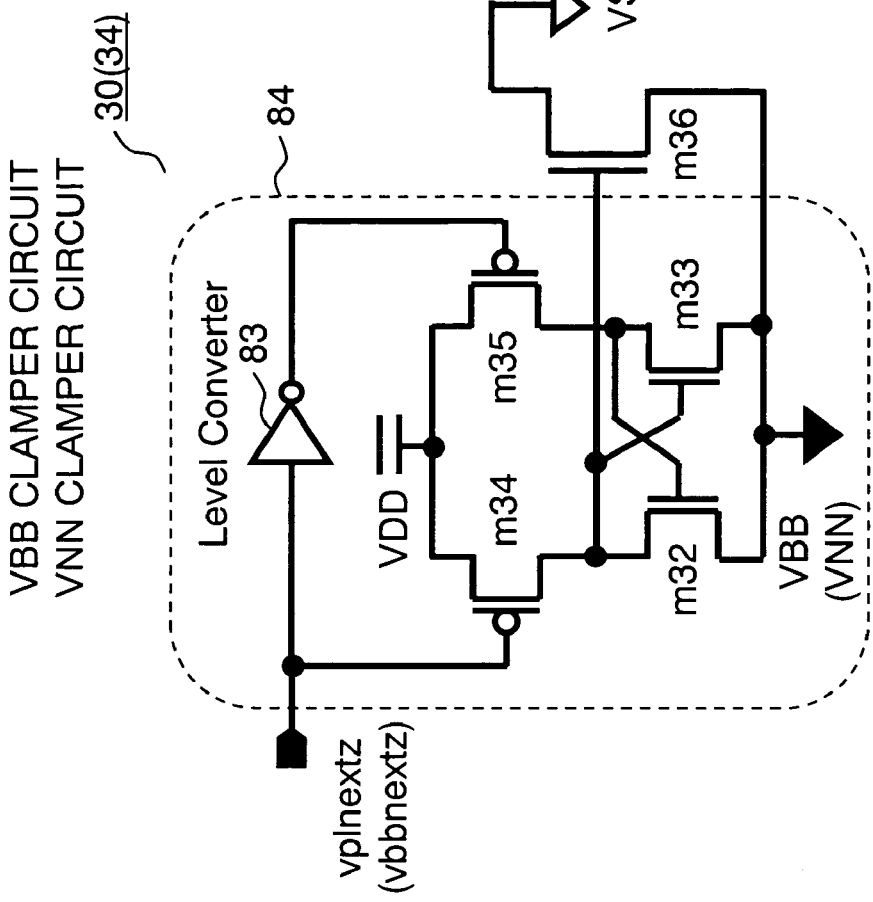

FIG. 13 is a circuit diagram of the damper circuit. The damper circuit is a circuit that connects the clamped power supply to the power supply to be clamped. In the case of the VPL damper 24 shown in FIG. 13A, in response to the high level of the VPL previous-stage signal vplprevz, the transistor m31 becomes nonconductive due to the low-level output of the inverter 82 and the connection state between the power supply VPL and ground potential VSS is canceled. The VBLEQ clamper 24 also has the same constitution and operates in the same manner. Further, the VBB clamper 30 shown in FIG. 13B is constituted by a level converter 84, which comprises transistors m32 to m35 and an inverter 83, and a clamp transistor m36. In order to connect the negative power supply VBB to the ground potential VSS, the power supply VDD level and negative power supply VBB level must be applied to the gate of the transistor m36. Therefore, the VPL next-stage signal vplnextz having the power supply VDD-VSS level is level-converted by means of the level converter 84. The connection of the negative power supply VBB to ground potential VSS by means of the transistor m36 is the same as that of the VPL clamper. Further, the circuit of the VNN clamper 34, which likewise clamps the negative power supply VNN to the ground potential VSS, also has the same constitution.

Figure 14:
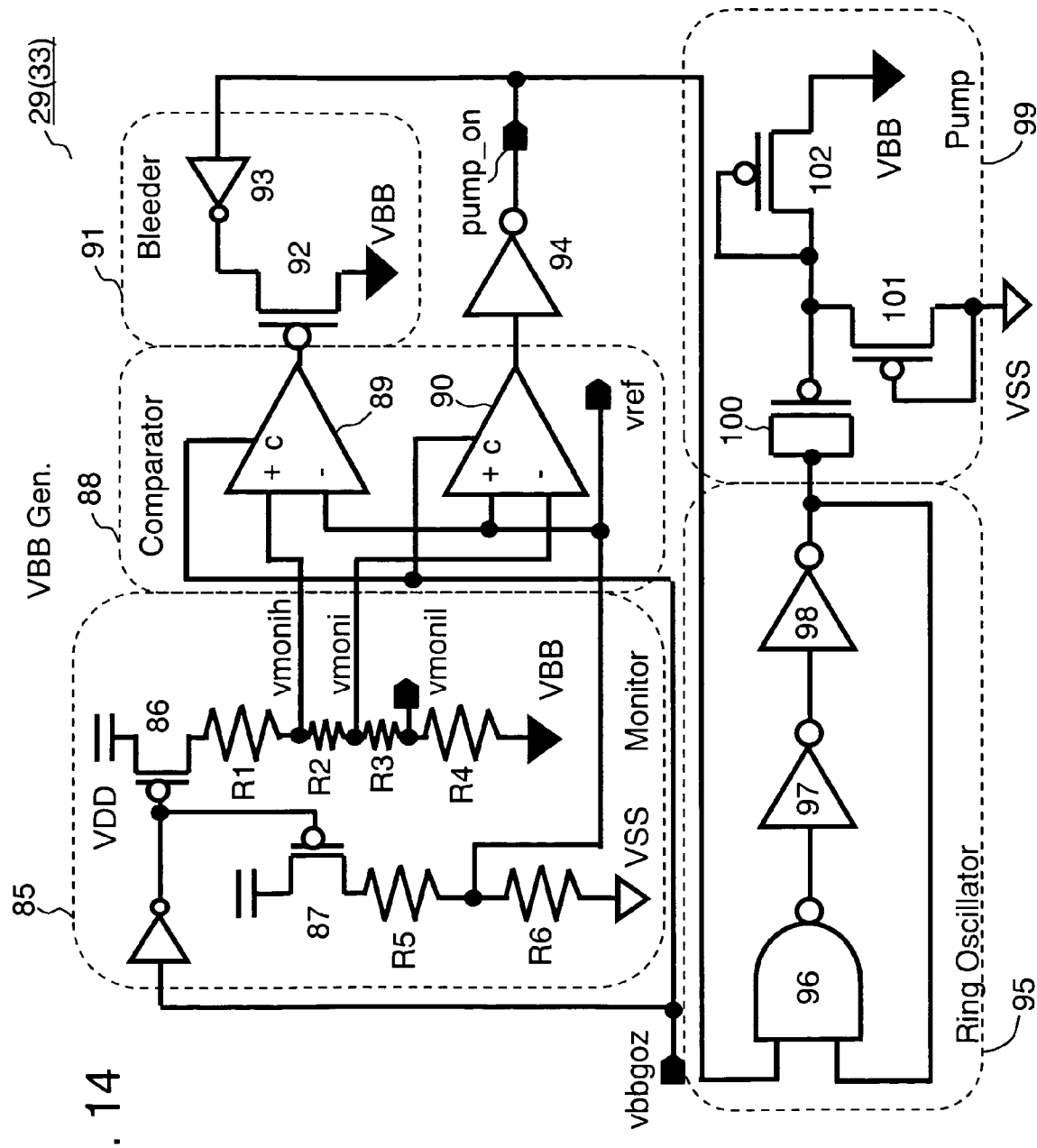
FIG. 14 is a circuit diagram of a VBB power supply generation circuit.

FIG. 14 is a circuit diagram of the VBB power supply generation circuit. The VBB power supply generation circuit 29 comprises a monitor portion 85, which generates monitor voltages vmoni, vmonih, vmonil and the reference voltage vref in accordance with the level of the power supply VBB, a comparator portion 88, which compares the monitor voltages with the reference voltage, a bleeder 91, which is driven by a comparator 89 of the comparator portion 88, an inverter 94, which generates a pumping signal pumpon that is driven by the comparator 90, a ring oscillator 95, and a pump circuit 99. The monitor portion 85 generates the reference voltage vref by means of a transistor 87 and resistors R5 and R6 and generates the monitor voltages vmoni, vmonih, vmonil by means of the transistor 86 and resistors R1 to R4. The reference voltage vref and monitor voltage vmonil are inputted to the inputs V1 and V2 of the VBB startup detection circuit respectively. Further, the monitor voltages vmoni and vmonih are inputted along with the reference voltage vref to the comparators 90, 89.

Therefore, to describe the operation, when the VBB startup signal vbbgoz is at the high level, the transistors 86, 87 of the monitor portion conduct and generate the monitor voltages and reference voltage above. Further, while the power supply VBB is high, the monitor voltage is also high, meaning that the output of the comparator 90 is at the low level and the inverter 94 sets the pumping signal pumpon at the high level to start up the ring oscillator 95. The ring oscillator 95 is constituted by a NAND gate 96 and inverters 97 and 98 and oscillates at a predetermined cycle. In accordance with the oscillation clock of the ring oscillator, current is drawn via a pumping capacitor 100, from the back gate bias power supply VBB and via the transistor 102, and the drawn current is then outputted to the ground power supply VSS via the transistor 101. This is the pumping operation.

At length, when the power supply VBB drops, the output of the comparator 90 is at the high level, the ring oscillator 95 stops and the pumping operation stops. Further, in cases where the level of the power supply VBB has dropped too far, the monitor voltage also drops and the output of the comparator 89 is at the low level, the transistor 92 conducts, current is supplied from the power supply VDD of the inverter 93 to the power supply VBB, and the potential of the power supply VBB is pushed up. That is, the bleeder 91 prevents the level of the power supply VBB going too deep for whatever reason. Therefore, the bleeder 91 need not be provided.

The VNN power supply generation circuit, which generates the same negative power supply as the power supply VBB, has the same circuit constitution as that described above.

Thus, the pumping capacitor 100 is provided in the circuit that generates the negative power supply. The larger the capacitance of the capacitor, the higher the pumping capability and the greater the current driving capability. However, increases to the pumping capacitor 100 are limited due to constraints of the layout surface area. According to this embodiment, as a result of the step-down from the overdrive level of the VPL power supply, the negative power supply VBB is stepped down through capacitance coupling and the pumping capability of the negative power supply generation circuit is enhanced.

Figure 15:
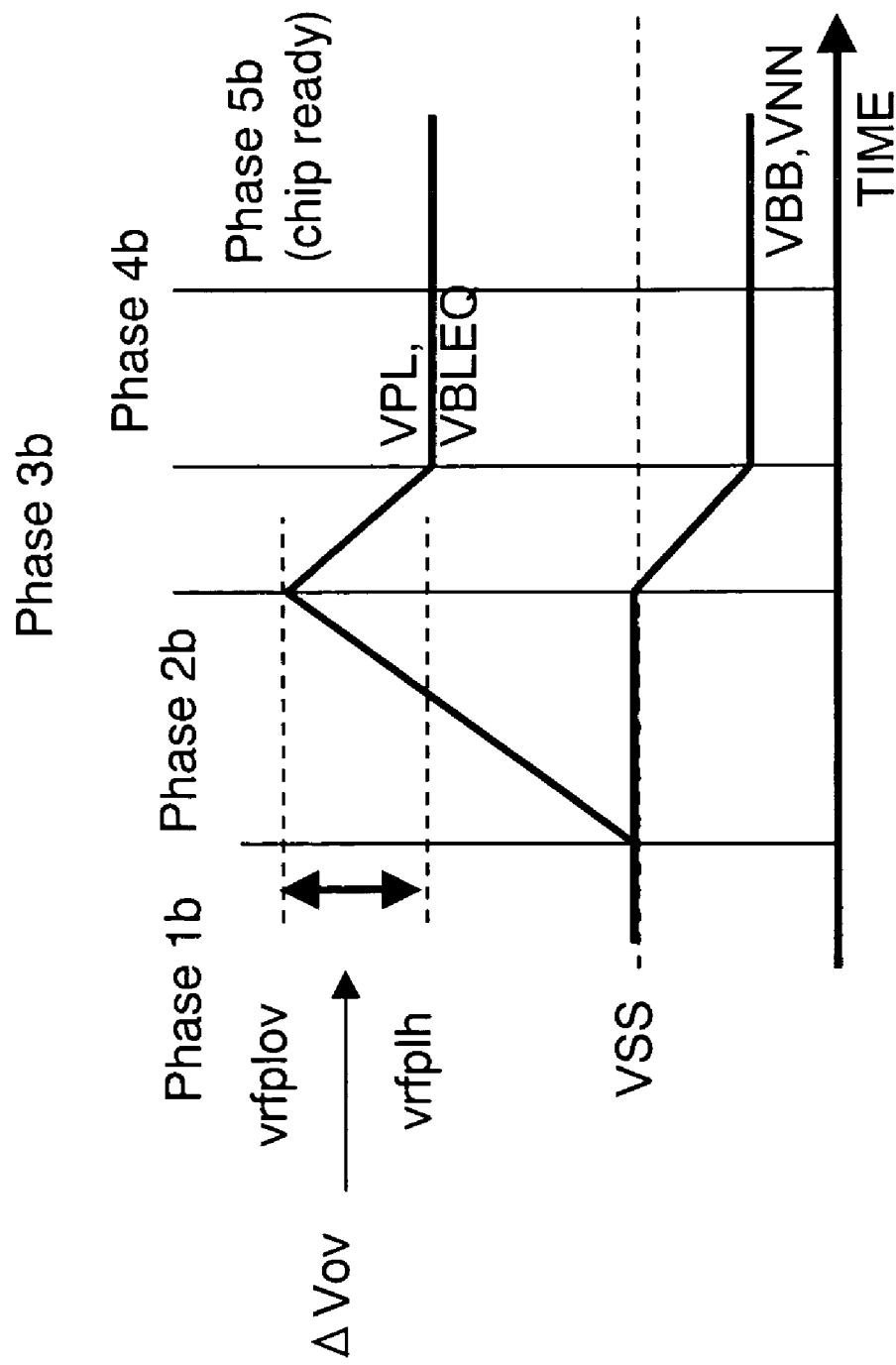
FIG. 15 shows a modified example of a power supply startup method of this embodiment.

FIG. 15 shows a modified example of the power supply startup method of this embodiment. In this modified example, in phase 3b, when the power supplies VPL and VBLEQ are stepped down from the level of the overdrive potential vrfplov to the normal level, both the negative power supply VBB and VNN are stepped down through capacitance coupling. For this reason, in phase 3b, the clamper 34 of the word-line reset power supply VNN is disabled.

FIG. 16 shows another modified example of the power supply startup method of this embodiment. In this modified example, in phase 3b, only the cell plate power supply VPL is stepped down from the overdrive potential to the normal level and the negative power supply VBB is stepped down through capacitance coupling. Further, in phase 4b, the power supply VBLEQ is stepped down from the overdrive potential to the normal level and the negative power supply VNN is stepped down through capacitance coupling. Therefore, a step-down of the negative power supply through capacitance coupling may be individually performed. Based on the memory cell constitution, a combination of the positive power supply and negative power supply can be suitably selected in order to permit the most effective usage of the coupling capacitance. Further, the level of the overdrive potential can be suitably selected in accordance with the size of the coupling capacitance.

Although the usage of a trench capacitor as the memory-cell cell capacitor was described by way of example in the above embodiment, even when a stack capacitor is employed, the driving capacity of the negative power supply generation circuit can be enhanced in the same manner as long as the positive power supply arranged via a capacitance in a back gate bias power supply constituting a negative power supply is stepped down after being overdriven.

According to the embodiment hereinabove, the capability for stepping down the negative power supply at power supply startup can be enhanced without increasing the driving capability of the negative power supply generation circuit. Therefore, the negative power supply generation circuit can be designed with the driving capability that is required during standby and thus the surface area of the pumping capacitor can be reduced.

What is claimed is:

1. A semiconductor integrated circuit device, which drives a first region and a second region provided via capacitance to a positive internal power supply and a negative internal power supply respectively, comprising:
    a first internal power supply generation circuit that drives the first region to the positive internal power supply; and
    a power supply sequencer that drives the first region to an overdrive potential higher than the positive internal power supply potential by starting up the first internal power supply generation circuit at power supply startup while clamping the second region at a predetermined potential, and then by canceling the clamped state of the second region, steps down the first region from the overdrive potential toward the positive internal power supply potential, so as to step down the second region to a negative potential through coupling of the capacitance.

2. The semiconductor integrated circuit device according to claim 1, further comprising:
    a second internal power supply generation circuit that drives the second region to a negative internal power supply,
    wherein the second internal power supply generation circuit includes:
    a pumping circuit having a pumping capacitor; and
    an oscillation circuit supplying a drive pulse to the pumping circuit.

3. The semiconductor integrated circuit device according to claim 1, further comprising:
    a memory core having a plurality of memory cells,
    wherein the first region is a cell plate region of the memory cell, the second region is a back gate region of a cell transistor of the memory cell, the positive internal power supply is a cell plate power supply that is applied to the cell plate region, and the negative internal power supply is a back gate bias power supply that is applied to the back gate region.

4. The semiconductor integrated circuit device according to claim 1, further comprising:
    a memory core having a plurality of memory cells, a plurality of word lines, and a plurality of bit lines,
    wherein the first region is either one or both of a cell plate region and bitline region of the memory cell;
    the second region is either one or both of a back gate region and wordline region of a cell transistor of the memory cell;
    the positive internal power supply is either one or both of a cell plate power supply that is applied to the cell plate region and a bitline pre-charge power supply that is applied to the bitline region; and
    the negative internal power supply is either one or both of a back gate bias power supply that is applied to the back gate region and a wordline reset power supply that is applied to the word lines.

5. The semiconductor integrated circuit device according to claim 3 or 4, wherein the memory cell includes a cell capacitor and the cell capacitor is constituted by a trench capacitor formed in the cell plate region.

6. The semiconductor integrated circuit device according to claim 3 or 4, wherein the memory cell comprises:

the cell plate region formed in a semiconductor substrate;
the back gate region formed in the cell plate region; and
a source region and drain region formed in the back gate region.

7. The semiconductor integrated circuit device according to claim 1, further comprising:
a ground power supply; and
an external power supply,
wherein the positive internal power supply is a potential between the ground power supply and the external power supply.

8. The semiconductor integrated circuit device according to claim 1, wherein the first internal power supply generation circuit includes:
a positive power supply startup circuit that starts up the positive internal power supply to the overdrive potential by using the external power supply; and
a positive power supply generation circuit that holds the positive internal power supply at a predetermined positive internal power supply potential,
wherein the power supply sequencer starts up the positive internal power supply to the overdrive potential by means of the positive power supply startup circuit and steps down the positive internal power supply by means of the positive power supply generation circuit.

9. A semiconductor memory device, including a plurality of memory cells, and in which a cell plate region and a back gate region of a cell transistor provided via a capacitance are driven to a positive internal power supply and a negative internal power supply respectively, comprising:
a first internal power supply generation circuit that drives the cell plate region to the positive internal power supply;
a second internal power supply generation circuit that drives the back gate region to the negative internal power supply; and
a power supply sequencer that drives the cell plate region to an overdrive potential higher than the positive internal power supply potential by starting up the first internal power supply generation circuit at power supply startup while clamping the back gate region at a predetermined potential, and by canceling the clamped state of the back gate region, steps down the cell plate region from the overdrive potential toward the positive internal power supply potential by means of the first internal power supply generation circuit, so as to step down the back gate region to a negative potential through coupling of the capacitance.

10. The semiconductor memory device according to claim 9, wherein the first internal power supply generation circuit includes:
a positive power supply startup circuit that starts up the positive internal power supply to the overdrive potential by using the external power supply; and
a positive power supply generation circuit that holds the positive internal power supply at a predetermined positive internal power supply potential,
wherein the power supply sequencer starts up the positive internal power supply to the overdrive potential by means of the positive power supply startup circuit and steps down the positive internal power supply by means of the positive power supply generation circuit.

11. The semiconductor memory device according to claim 9, further comprising:
a ground power supply; and
an external power supply,
wherein the positive internal power supply is a potential between the ground power supply and external power supply.

12. The semiconductor memory device according to claim 9, wherein the memory cell includes:
the cell plate region formed in a semiconductor substrate;
the back gate region formed in the cell plate region; and
the source region and drain region of the cell transistor formed in the back gate region.

* * * * *